(12) United States Patent
Kuttner

(10) Patent No.: US 6,803,870 B2
(45) Date of Patent: Oct. 12, 2004

(54) PROCEDURE AND DEVICE FOR ANALOG-TO-DIGITAL CONVERSION

(75) Inventor: Franz Kuttner, St. Magdalen (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/642,730

(22) Filed: Aug. 19, 2003

(65) Prior Publication Data

US 2004/0036641 A1 Feb. 26, 2004

(30) Foreign Application Priority Data

Aug. 20, 2002 (DE) .......................... 102 38 028

(51) Int. Cl.⁷ .............................................. H03M 1/12
(52) U.S. Cl. .................................... 341/155; 341/118
(58) Field of Search ................................. 341/155, 118, 341/120, 143, 144

(56) References Cited

U.S. PATENT DOCUMENTS

| 4,071,842 A | | 1/1978 | Tewksbury .............. 340/347 |
| 4,839,650 A | * | 6/1989 | Geen et al. .............. 341/118 |
| 6,195,032 B1 | | 2/2001 | Watson et al. ........... 341/162 |
| 6,496,128 B2 | * | 12/2002 | Wiesbauer et al. ...... 341/143 |

FOREIGN PATENT DOCUMENTS

| DE | 38 85 948 | 6/1994 |
| EP | 0 298 216 B1 | 1/1993 |

* cited by examiner

Primary Examiner—Brian Young
Assistant Examiner—Joseph Lauture
(74) Attorney, Agent, or Firm—Fitzpatrick, Cella, Harper & Scinto

(57) ABSTRACT

During A/D conversion of time-discrete analog input values, a quantizer is used in which an analog quantization error is obtained after every conversion. The quantization error is stored in a buffer, and fed back through a subtracter to at least one input value of a subsequent conversion. The quantizer has a conversion frequency, which is more than double the maximum frequency contained in input values, so the conversion operates in an oversampling mode. During feedback the quantization errors of several conversions, prior to a varying number of conversions, are preferably fed back to an input value. The invention can be used with all conventional quantizers, for which an analog quantization error can be obtained, so it is possible through a noise shaping procedure to shift quantization noise into higher-frequency spectral ranges to improve the signal-to-noise ratio or reduce the quantization noise in a useful spectral range.

12 Claims, 4 Drawing Sheets

PROCEDURE AND DEVICE FOR ANALOG-TO-DIGITAL CONVERSION

BACKGROUND OF THE INVENTION

1. Field of the Invention

The present invention relates to a procedure as well as a device for analog-to-digital conversion of time-discrete analog input values.

2. Related Background Art

For analog-to-digital (A/D) conversion of time-discrete analog input values numerous procedures or devices are known. The A/D converters, hereafter also called ADC's, can be divided into two groups. On the one hand the Nyquist ADC, which for every conversion assigns a digital output value to an analog input value, whereby the conversion rate to meet the Nyquist criterion is at least double the highest frequency to be converted in the input values. Such converters are for example converters based on successive approximation, flash converters, parallel converters or pipeline converters.

Furthermore Δ-modulators and ΣΔ modulators are known, in which analog input values are digitized, the digital output signal is again analogized by means of an analog-to-digital converter, and this analog value is fed back to at least a subsequent analog input value. Such A/D converters are operated at a higher frequency than would be necessary according to the Nyquist criterion. This is also called oversampling. Therefore a distribution of the quantization noise, which results from the inevitable quantization errors, can be achieved by means of a larger spectral range. The quantization noise can then be better eliminated from the digital output signal with the aid of suitable filters, whereby advantageously a digital filter can be used. Since with oversampling the difference between the conversion frequency and the highest frequency contained in the input signal to be converted is increased, advantageously the edge steepness can be reduced. Furthermore the procedure of noise shaping is known in the case of Δ-modulators and ΣΔ modulators, in which procedure the quantization noise is shifted by suitable feedback of the digital output signal of the quantizer from the useful bandwidth to the subband lying outside, where it can be filtered, so that the quantization noise in the useful bandwidth can be reduced further. Since in the case of Δ-modulators and ΣΔ modulators the digital value supplied by the quantizer is analogized and fed back again anyway in an analog-to-digital converter, noise shaping can be additionally introduced in such cases at little extra cost.

The implementation of noise shaping in the case of Nyquist ADC's is not known at present, so that A/D converters of this kind have greater quantization noise.

SUMMARY OF THE INVENTION

The object of the present invention is to provide a procedure or a device for analog-to-digital conversion of time-discrete analog input values, whereby the quantization noise can be reduced at low cost.

The object according to the invention is achieved by a procedure with the features of claim 1 or a device with the features of claim 12. The sub-claims in each case define advantageous and preferential embodiments of the present invention.

With the quantizer according to the invention the quantization error is computed in analog form and fed back to a subsequent input value. In this case the fact is exploited that with most A/D converters the quantization error is present inside the circuit and can be picked up in analog form. The quantization error is determined and fed back to at least a subsequent input value whereby this can take place for example with the aid of an analog subtracter.

For the feed back of a quantization error of a particular conversion to a subsequent input value the quantization error is preferably buffered. This can happen for example in a sample-and-hold unit. If each quantization error of a conversion of a particular input value is to be fed back to several subsequent input values, a plurality of memory units, in particular in the form of sample-and-hold units, may be provided, in order to be able to also store quantization errors for several conversion steps of the quantizer.

Feedback of a quantization error to at least a subsequent input value is equivalent to the feedback of at least one quantization error of a previous conversion to a particular input value. In both cases it happens that quantization errors of at least one previous conversion are fed back to an input value. If several quantization errors prior to a varying number of conversions are fed back to an input value, a delay network is preferably provided, in which the quantization errors are passed through as in a shift register, whereby after each conversion the quantization error, which preceded a particular number of conversions, can be picked up at the individual points of the delay network.

If quantization errors prior to a varying number of conversions are fed back to an input value, the different quantization errors can be evaluated with particular factors, which are selected as a function of how many conversions the fed-back quantization error preceded. In this way filtering similar to a digital filter is achieved, whereby in contrast to a digital filter time-discrete analog values are processed.

The delay network can in particular be built up from a daisy chain of sample-and-hold units.

The feedback of at least one quantization error to an input value must generally take place in such a way that the quantization error, possibly evaluated with a factor, is subtracted from the input value or added to it. For this purpose additionally to the use of an adder or a subtracter further possibilities may result dependent on the type of quantizer. If for example a quantizer works on the basis of successive approximation, then the quantizer necessarily comprises an analog-to-digital converter, to which the quantization error to be fed back can be relayed in addition to the input value. If the analog-to-digital converter used has at least one parallel connection of switched capacitors, which at one end are connected to each other and the other end of which can be supplied in a controllable way with the voltage to be quantized or a reference voltage, individual capacitors of this parallel connection can be set up in such a manner that they can be supplied at one end either with the reference voltage or with the quantization error.

With quantization based on the procedure of successive approximation the quantization error is at the end of the last approximation step and can be determined simply as the difference between the output signal of the A/D converter in the quantizer and the input value. Usually quantizers of this kind have a comparator for comparing the input value and the output value of the analog-to-digital converter, so that the quantization error is received by the comparator at the end of the conversion and can be picked up from this.

If a pipeline ADC is used the time delay for feeding back the quantization error to at least a subsequent input value can be achieved at particularly low cost. With pipeline ADC's of this kind an analog input value is stored in analog form and quantized with a particular resolution. The quantization result is sent to an analog-to-digital converter, the output signal of which is subtracted from the stored input value, whereby the resulting voltage difference represents the quantization error of the first quantization and is amplifier in a subsequent amplifier. This buffering, quantizing and amplification of the quantization error of an input value forms one stage of the pipeline ADC. In this stage the input value was already digitized with a particular resolution. The digital information determined thereby in the first stage is the highest value.

The quantization error amplified by the amplifier is fed to a next stage as an input value, which is structured in the same way as the first stage, so that the amplified quantization error of the first stage is stored and quantized with a particular resolution, whereby the quantization result is analogized in an analog-to-digital converter of the second stage and subtracted from the stored input value of the second stage and the differential voltage arising therefrom is again amplified.

Further stages can be joined onto the second stage. The resolution, with which the respective input value is quantized in each stage, is arbitrary. In principle the subsequent stages supply lower-grade information than the previous stage in each case.

If for example the respective input value is quantized with two bits in each stage, then the total resolution in bits results in 2 bits times the number of stages. The accuracy of the analog-to-digital converters used in the individual stages must be suitably adapted in this case. If for example a pipeline ADC has a total resolution of 10 bits, the analog-to-digital converter of the first stage, irrespective of the resolution of the first stage, must be accurate to at least 10 bits. Since in the subsequent stages still less valuable information or bits are recovered, the requirement for accuracy of the analog-to-digital converter is reduced in the subsequent stages.

A significant advantage of the pipeline ADC consists in that the input values are stored at each stage. In this way the first stage of processing the next input value does not have to wait until the previous input value has been processed by all stages. After processing for example a first input value by the first stage the quantization error arising as a result is stored by the second stage. While the second stage processes the quantization error of the first stage of the first input value, the first stage can already process the next second input value. In this way effectively with each processing step of the stages processing of a new input value is started or a new conversion result of an input value arises with each processing step of the stages. The quantization results obtained from the individual stages for this purpose however must be appropriately linked with one another. For this purpose the quantization results of the stages can be held in buffers, whereby each buffer stores the value of the assigned stage plus the stored value of the buffer from the previous stage. With progressive processing of an input value or the quantization errors in the stages arising during processing, at the same time the quantization results arising thereby are shifted along and summed up in this way. Error correction is also conceivable with a pipeline ADC, in which the amplification of the amplifiers in the individual stages and the resolution of the quantizers in the subsequent stages are harmonized in such a way that in relation to the total conversion result certain bits are converted at the same time in two adjacent stages. In this way errors of the quantizer can be balanced out and linearity errors corrected in the individual stages.

With pipeline ADC's of this kind the quantization error is picked up during the last stage. The feedback to subsequent input values can be implemented at particularly low cost, the quantization error being fed back in analog form in a previous stage and received by the subtracter present there anyway.

The present invention can also be used with parallel or flash converters, in which the input value is compared with a string of several reference voltages, the results of the comparisons being priority-coded. The reference voltages are picked up in particular on a series circuit by resistors, whereby a reference voltage is applied to the series circuit. Crucial for the conversion result in the case of an ADC of this kind is the comparison at which the smallest voltage difference arises between the input value and the reference voltage. In practice the comparisons between the reference voltages and the input value provide a digital value, if the comparisons are wired as comparators for example, so that the comparator, which still indicates for the highest reference voltage that the input value lies above the reference voltage, is crucial for the conversion result. Equally the comparator, which indicates for the lowest reference voltage that the reference voltage is below the input value, can be used as the ruling comparator. With an ADC of this kind the quantization result which was crucial for the conversion result must be picked up at the comparator. For this purpose it must be possible for example with the aid of a multiplexer to be able to select the input differential voltage of each comparator in order to be able to feed this quantization error back.

Advantageously the quantizer is operated at a frequency, which is more than double the highest frequency arising in the useful spectral range to be converted. In other words oversampling is preferably used, in order to be able to reduce the quantization noise.

The quantization error is preferably fed back to the subsequent input values in such a way that the quantization noise is shifted from the useful spectral range to higher-frequency spectral ranges, so that the quantization noise in the useful spectral range can be reduced.

BRIEF DESCRIPTION OF THE DRAWINGS

The invention is described in detail below on the basis of preferential embodiments with reference to the attached drawings.

DETAILED DESCRIPTION OF THE INVENTION

Figure 1:
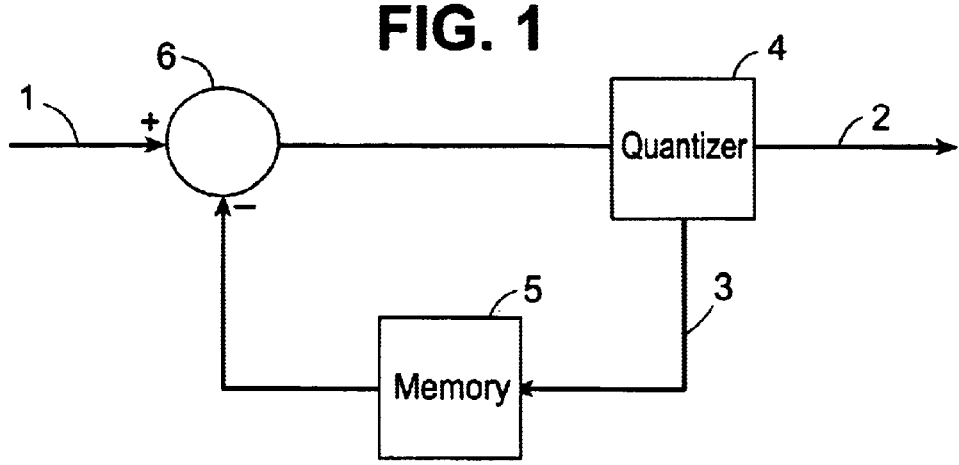
FIG. 1 is a schematic illustration of a first embodiment of the present invention.

The A/D converter illustrated schematically in FIG. 1 serves to produce digital output values 2 as a function of analog time-discrete input values 1. For this purpose the A/D converter has a quantizer 4, which after each conversion outputs the quantization error 3 in analog form. The quantization error 3 is buffered by an intermediate memory 5 and fed back with negative operational signs to the input values 1. For this purpose the output signal of the intermediate memory (buffer) 5 is deducted in a subtracter 6 from the input value 1. The differential voltage arising in this case is fed to the input of the quantizer 4. After a conversion of the quantizer 4 the quantization error 3 arising in this case is stored by the buffer 5 and sent to the subtracter 6. The quantization error of the previous conversion is therefore subtracted from the next input value 1 and the quantizer 4 receives the difference obtained from the subtracter, whereupon the quantization error arising as a result of this conversion is loaded into the buffer 5 for subtraction of the next in turn input value 1.

If it is assumed that the input values 1 form a signal, in the spectral range of which a so-called critical frequency is the highest frequency arising, the quantizer 4 is operated at a conversion frequency, which is more than double the critical frequency. Preferably the conversion frequency of the quantizer 4 is an integral multiple of double the critical frequency and the ratio between the conversion frequency of the quantizer 4 and double the critical frequency in particular corresponds to a power of two. That is to say that the A/D converter illustrated in FIG. 1 operates in the oversampling mode.

The feedback of the analog quantization error according to the invention enables the quantization noise from the spectral range up to the critical frequency to be shifted to spectral ranges of higher frequencies and therefore the quantization noise in the spectral range below the critical frequency is reduced. The greater the ratio between the conversion frequency of the quantizer 4 and the critical frequency, the more effectively the quantization noise in the useful spectral range below the critical frequency is reduced.

Since with the A/D converter according to the first embodiment the quantization error is only retarded by one conversion step and is fed back to the respective subsequent input value, in the present case this is called noise shaping of the first order.

Figure 2:
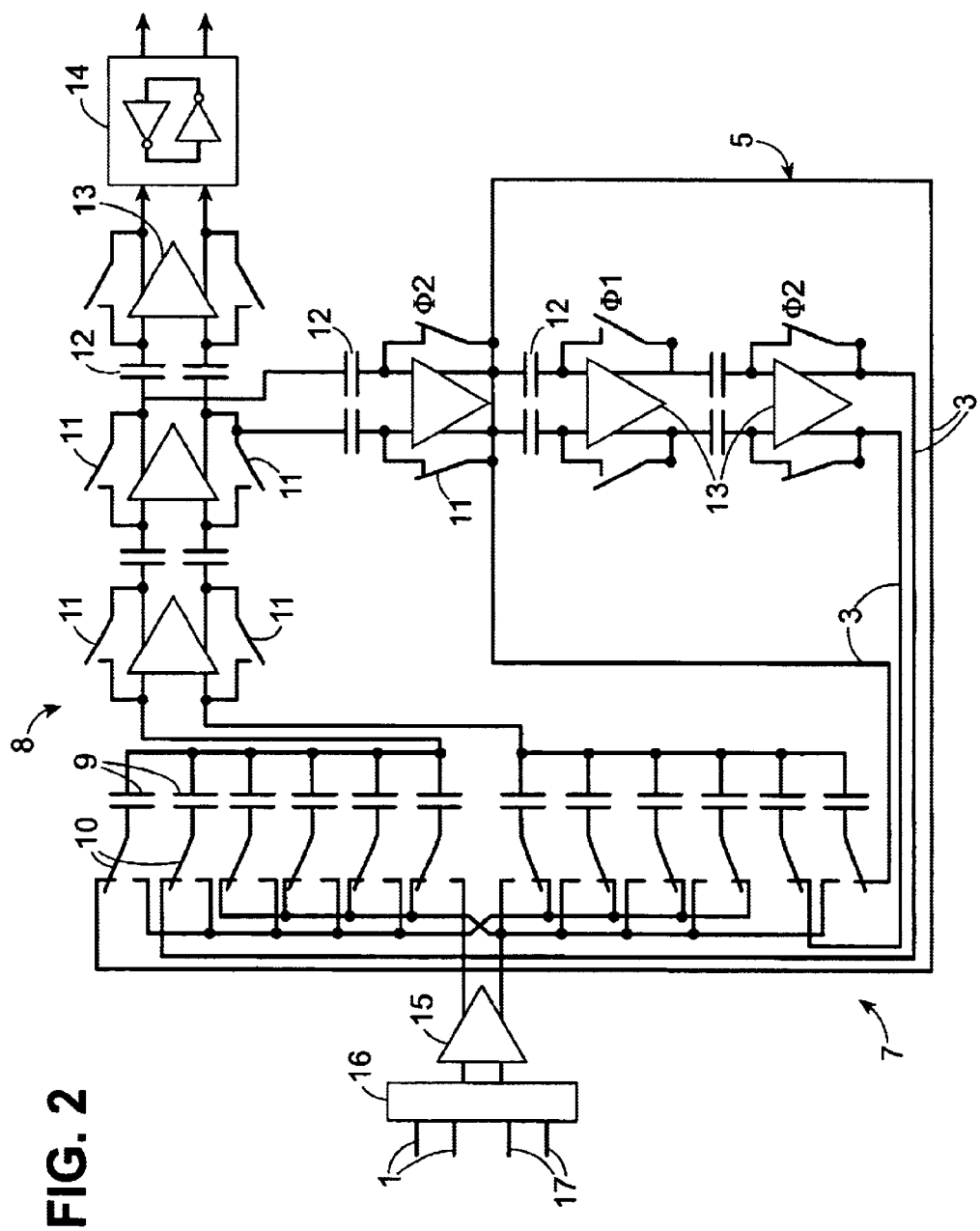
FIG. 2 is a detailed illustration of the circuit design of an analog-to-digital converter according to a second embodiment of the present invention.

FIG. 2 shows an A/D converter according to a second embodiment of the present invention, with which noise shaping of the second order is implemented. The A/D converter illustrated in FIG. 2 works on the basis of successive approximation. For this purpose the circuit illustrated comprises an analog-to-digital converter 7, which consists of parallel capacitors 9, which are connected at one end and the other ends of which can be connected by means of switch 10 to one of two differential outputs of an input buffer 15. The input buffer 15 controlled by means of a multiplexer 16 receives either a differential input value 1 or a differential reference voltage 17. The output of the analog-to-digital converter 7 is relayed to a comparator 8, which consists of three differential amplifiers 13 connected in series, whereby a coupling capacitor 12 is provided between the 1st and 2nd and 3rd differential amplifiers 13 and in addition each differential amplifier 13 can be enabled or activated by means of a switch 11. The output of the last differential amplifier 13 of the comparator 8 is sent to a latch 14, in which the result of the comparator 8 is present in digital form.

For conversion of an input value 1 this is relayed with the aid of the multiplexer 16 to the input buffer 15. By suitable control of the switches 10 the input value 1 is loaded into capacitors 9, whereupon the multiplexer 16 switches over and next is sent to the input buffer 15 with the reference voltage 17. In the following phase of successive approximation the switches 10 are controlled by a logic, not illustrated, in such a manner that by relaying in a varying way the reference voltage 17 appearing at the differential outputs of the input buffer 15 to the capacitors 9 the differential output signal at the analog-to-digital converter 7 becomes as small as possible. For this purpose after each activation of the switches 10 by means of the comparator 8 the operational sign of the differential output signal of the analog-to-digital converter 7 is determined and passed on via the latch 14 to the logic for successive approximation. At the end of the successive approximation phase the quantization error is present in analog form at the output of the analog-to-digital converter 7. This is taken over by a multistage buffer 5. The buffer 5 of the A/D converter according to the second embodiment of the present invention in total has three differential amplifiers 13 with assigned enabling switches 11, whereby a coupling capacitor 12 is connected before each input of a differential amplifier 13. The three differential amplifiers 13 of the buffer 5 are arranged vertically in FIG. 2. After the end of the successive approximation phase the quantization error of the previous conversion is taken over by the coupling capacitor 12 of the highest differential amplifier 13. With closed activation switches 11 of the highest differential amplifier 13 of the buffer 5 the quantization error is passed on in differential form to the highest or lowest capacitor 9. The voltage fed to these two capacitors is subtracted from the input value 1 in the next conversion phase. This is implemented via load distribution, if the next input value 1 has been loaded by the multiplexer 16, the input buffer 15 and suitably connected switches 10 into some of the other capacitors 9. In this way the quantization error of a previous conversion is fed back with negative operational signs to the respective subsequent input value 1.

The buffer 5 still possesses two more differential amplifiers 13, with which the quantization error can be buffered from the highest differential amplifier 13, so that a two-stage buffer 5 results, with which the quantization errors of the two respective previous conversions can be stored. The quantization error, which is present at the lowest differential amplifier 13 of the buffer 5, originates from the one before the previous conversion and is also fed back to the analog-to-digital converter 7. With the aid of the capacitance of the capacitor 9, into which the quantization error is loaded for feeding back and by activating the switches 10 during load redistribution for feeding the stored quantization errors back to the next input value 1 the factor with which a quantization error is fed back to the input value 1 can be specified. In the present case the quantization error of the conversion previous to one conversion is fed back with the factor −2 and the quantization error of the conversion previous to two conversions is fed back with the factor +1.

With the aid of the A/D converter with noise shaping of the second order, illustrated in FIG. 2, the quantization noise in the useful spectral range is reduced even further. Advantageously by choosing an analog-to-digital converter 7 with capacitors 9 a sample-and-hold unit is eliminated, since the input value 1 can be sampled in a capacitor 9.

Figure 3:
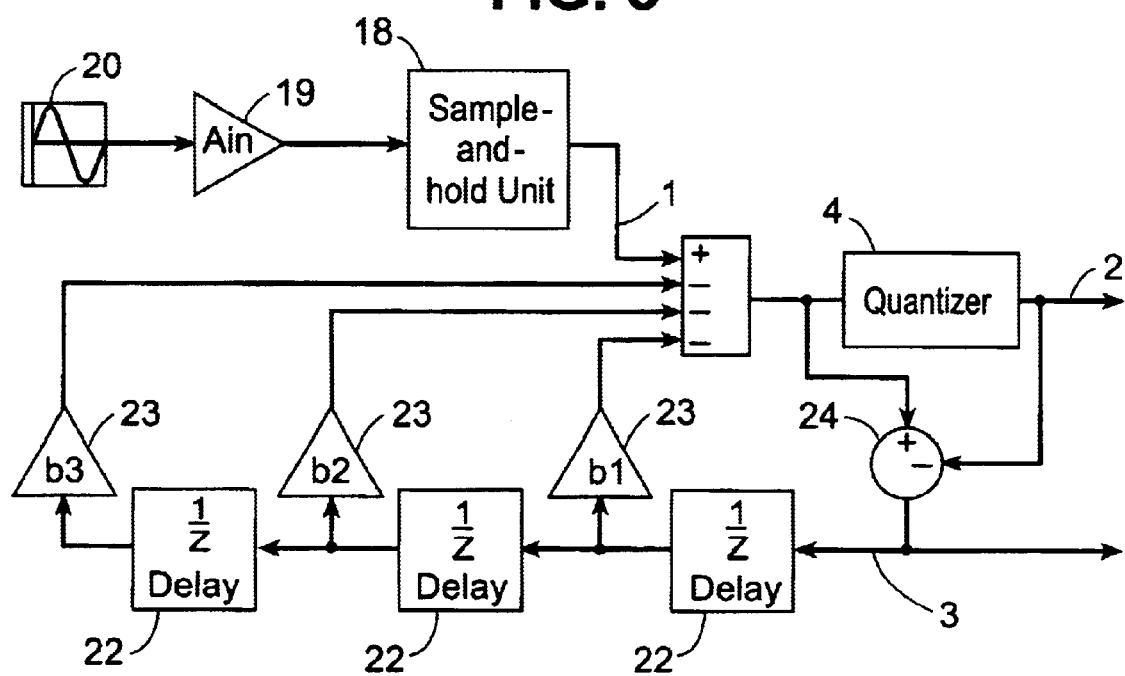
FIG. 3 is a simulated diagram to clearly show an analog-to-digital converter according to a third embodiment of the present invention.

FIG. 3 shows a block diagram of an analog-to-digital converter according to a third embodiment of the present invention. Additional components are illustrated, which are only used for testing the A/D converter. In the present case sinus oscillation is used as a test signal, which is produced by a signal source 20 and amplified by a preamplifier 19. The output signal of the preamplifier 19 is converted in a sample-and-hold unit 18 into a time-discrete analog signal 1, consisting of time-discrete analog input values 1. The input values 1 or the input signal 1 are sent to an adder or a subtracter 21, which forms a linear combination of closely adjacent input signals, and the output signal of which is relayed to a quantizer 4. In practice a quantizer 4, in which after conversion the quantization error of the conversion can be picked up in analog form, is used. Since only normal functional components have been used for clarity in FIG. 3, the quantization error 3 is formed by determining the difference between the input and the output of the quantizer 4. For this purpose a differentiation element 24 is provided, in which the difference is formed from the output signal of the adder or subtracter 21 or the input signal of the quantizer 4 and the output signal 2 of the quantizer 4. This subtracter 24 is introduced into the diagram as in FIG. 3 only to assist comprehension and does not arise in practice. Instead the quantization error 3 is directly picked up at the quantizer 4. The quantization error 3 is sent to a series of several time-lag devices 22, which in each case retard the input signal relayed to them by one time interval, whereby the time intervals correspond to the clock of the conversions, so that one time interval corresponds to one conversion. This means that the quantization error 3 of the previous conversion is found on the output of the first time-lag device 22, illustrated on the right. The quantization error 3 of the conversion previous to two conversions is found on the output of the second time-lag device 22, illustrated in the centre. Accordingly the quantization error of the conversion previous to three conversions is found on the output of the last time-lag device 22, illustrated on the left. The output signal of each time-lag device 22 is multiplied by an amplifier 23 by a factor and fed to an input with negative operational signs of the adder or subtracter 21. The quantizer 4 therefore receives input values 1, to which the quantization errors 3 of the three previous conversions in each case are fed back with different factors. Factor b1 for the quantization error 3 retarded by one conversion is −3, factor b2 for the quantization error 3 retarded by two conversions is +3 and factor b3 for the quantization error 3 retarded by three conversions is −1.

With the A/D converter illustrated schematically in FIG. 3 therefore noise shaping of the third order can be executed, whereby in the lower frequency range the quantization noise and therefore the signal-to-noise ratio can be far better improved compared to an A/D converter without feedback of the quantization error.

As already stated at the beginning, the present invention can be used with any quantizer in which the quantization error is present or can be picked up after each conversion in analog form.

Figure 4:
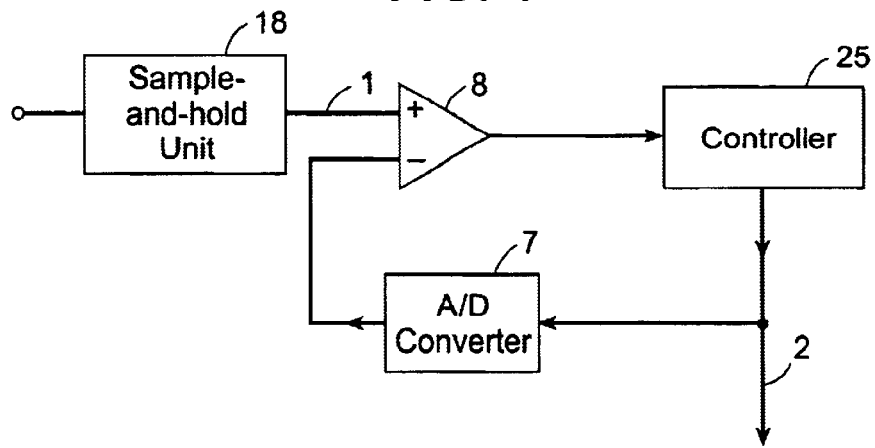
FIG. 4 is the schematic structure of a quantizer for use in an analog-to-digital converter according to the first or third embodiment of the present invention.

Quantizers are suitable for use in an A/D converter according to the first and third embodiments, which quantizers work on the principle of successive approximation. FIG. 4 schematically illustrates the block diagram of a quantizer of this kind. With the aid of a sample-and-hold unit 18 an input signal 1 is created from time-discrete analog input values 1. The input values 1 are compared by a comparator 8 with the output signal of an analog-to-digital converter 7, whereby the output signal of the comparator 8 is evaluated by control equipment 25, which is also called a successive approximation register. The control equipment 25 digitally controls the analog-to-digital converter 7 according to the known successive approximation procedure in such a manner that in a conversion the difference between an input value 1 and the analog output signal of the analog-to-digital converter 7 is as small as possible. At the end of the conversion the digital value, which is sent to the analog-to-digital converter 7, represents the conversion result 2. The quantization error can be picked up in such a case as the differential voltage between the two inputs of the comparator 8 after each conversion. All known forms of embodiment are deemed to be analog-to-digital converters.

In order to extend the quantizer illustrated in FIG. 4 to an A/D converter according to the invention, the buffer 5 and the adder or subtracter 6 according to FIG. 1 must be provided additionally to the components illustrated in FIG. 4. The quantization error 3 is picked up by means of a differential amplifier, not illustrated, by the inputs of the comparator 8 at the end of each conversion and stored in the buffer 5.

Figure 5:
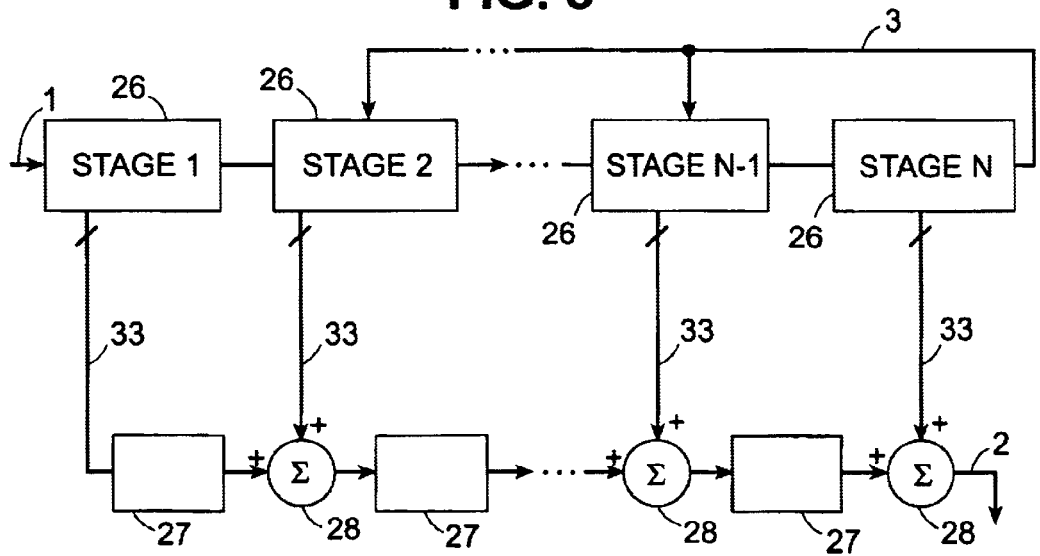
FIG. 5 is a schematic illustration of an analog-to-digital converter according to a fourth embodiment of the present invention.
Figure 6:
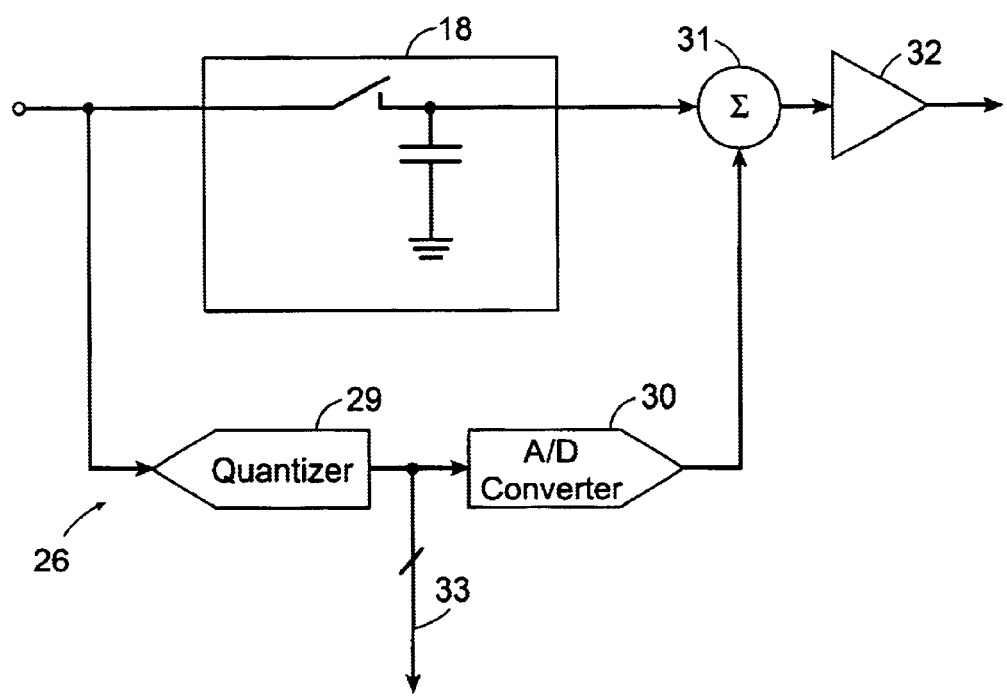
FIG. 6 is the illustration of a stage of the analog-to-digital converter in accordance with FIG. 5.

Part of a further embodiment of the present invention is illustrated in FIGS. 5 and 6. This relates to a pipeline quantizer with feedback of the quantization error 3 from previous conversions. FIG. 1 illustrates a block diagram of the A/D converter according to the invention, whereby the pipeline quantizer has an analog portion consisting of the blocks 26 and a digital portion consisting of the buffers 27 and the digital adder 28. The analog portion can be divided into several stages, whereby a stage corresponds to a block 26.

FIG. 6 shows the structure of a block 26 for a stage of the pipeline quantizer. Each block 26 comprises a sample-and-hold unit 18, with which a signal to be found on the left of the respective input can be buffered. At the same time the input signal in each case to be found on the left of a stage quantizer 29, which may be a normal A/D converter, is quantized with a particular resolution. The stage quantizer 29 produces a digital output signal 33, which is again relayed to an analog-to-digital converter 30, the output signal of which is subtracted in a subtracter 31 by the signal stored in the sample-and-hold unit 18. The difference signal at the output of the subtracter 31 is amplified by an amplifier 32 and passed on as an output signal to the next stage. In operation a value, which is digitized with a particular resolution and digitally output as value 33, is found at a block 26 according to FIG. 6 on the left. At the same time the amplified quantization error of the quantization into this stage is found on the right at the output of the amplifier 32.

As a result of the chain structure in FIG. 5 the quantization error of the previous block is quantized in a subsequent stage on the right of the block 26 contained in it. If for example four stages are provided and each stage works with a resolution of 2 bits, in the first stage, shown on the left, the two most significant bits are converted, that is to say the MSB bit 7 and bit 6, in the following stage bits 5 and bit 4, in the third stage bits 3 and 2 and in the last stage bits 1 and 0. In order to combine these time-staggered quantization results 33 into the total conversion result, the quantization results 33 of the individual blocks 26 of the individual stages are further shifted to the right in the digital portion by means of the buffers 27. In this case the summation result of an in each case upstream digital adder 28 is stored by a buffer 27. This forms the sum of the previous buffer and the quantization result of the assigned block 26, so that after a number of conversion steps, which corresponds to the number of stages or blocks 26, the conversion result 2 is to be found on the last summation element 28 illustrated on the right.

With the aid of the sample-and-hold units 18 in each block 26 the individual blocks 26 can work in parallel, so that while a block quantizes the input signal 1 or the quantization error of the previous block 26 of a conversion, the previous block, which is illustrated on the left in each case, can already process the input value 1 or the quantization error of the previous block 26 of the next conversion. Therefore with each quantization operation of the blocks 26 a conversion of an input value 1 is completed or a conversion result 2 is obtained.

The quantization error 3 for the individual conversions is to be found at the output of the last block 26, illustrated on the right. This is fed back according to the present invention, whereby due to the time-staggered execution of the conversion in different stages, the quantization error 3 can be fed back without buffers, by being fed back to the blocks 26 of previous stages. The quantization error 3 is fed back to a particular number of previous stages, depending on which order the desired noise shaping is classed as. The fed-back quantization error is thereby sent to the adder 31 inside each receiving block 26, whereby an amplifier can be inserted, which multiplies the fed-back quantization error 3 by a particular factor. In this way the present invention can be implemented with a pipeline quantizer at low cost. The resolution of the stage quantizer 29 can also be 1 bit.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims.

What is claimed is:

1. A method for analog-to-digital conversion of time-discrete analog input values, by means of a quantizer which is set up in such a manner that it provides an associated digital output value after conversion of an input value, the method comprising the steps of:

after each conversion of an input value, determining a quantization error of the quantizer in analog form by directly picking up the quantization error at the quantizer; and feeding back in analog form the quantization error to at least a subsequent input value.

2. The method according to claim 1, wherein the quantizer has a conversion frequency that is greater than double a highest frequency contained in a useful spectral range of input values to be converted.

3. The method according to claim 2, wherein the conversion frequency of the quantizer is an integral multiple of the highest frequency contained in the useful spectral range to be converted.

4. The method according to claim 1, wherein the quantization error is fed back in analog form in such a manner that quantization noise is shifted at least partially from the useful spectral range to be converted to higher-frequency spectral ranges.

5. The method according to claim 1, wherein the quantization error of a conversion of the quantizer is fed back to several subsequent input values, the quantization error being multiplied by a respective factor for each one of the several subsequent input values to which the quantization error is fed back.

6. The method according to claim 1, wherein the quantization error is acquired and stored by means of a sample-and-hold unit.

7. The method according to claim 6, wherein quantization errors of conversions of the quantizer in a delay network are passed on from several sample-and-hold units in a clock of the conversions of the quantizer.

8. The method according to claim 1, wherein the quantizer is a quantizer according to a procedure of successive approximation.

9. The method according to claim 1, wherein the quantizer is a pipeline analog-to-digital converter.

10. The method according to claim 9, wherein the quantization error is picked up at a last stage of the pipeline analog-to-digital converter and for feeding back to subsequent conversions of the quantizer is fed back to a previous stage of the pipeline analog-to-digital converter.

11. The method according to claim 1, wherein the quantizer operates according to a parallel procedure, in which input values are compared in binary form with a plurality of reference voltages, wherein results of such comparisons are priority-decoded and the quantization error is formed by a difference between a respective input value and a corresponding reference voltage, a binary comparison of which with the respective input value had a highest priority for priority coding.

12. A device for analog-to-digital conversion of time-discrete analog input values with a quantizer, arranged to provide an associated digital output value after conversion of an input value, wherein the device comprises a feedback portion arranged such that, after a conversion of an input value, said feedback portion feeds back a quantization error of the quantizer determined in analog form by directly picking up the quantization error at the quantizer to at least a subsequent input value.

* * * * *